United States Patent
Coutts

(10) Patent No.: US 11,088,453 B1
(45) Date of Patent: Aug. 10, 2021

(54) VERTICAL COUPLING STRUCTURE FOR ANTENNA FEEDS

(71) Applicant: Amazon Technologies, Inc., Seattle, WA (US)

(72) Inventor: Gordon Coutts, Woodinville, WA (US)

(73) Assignee: Amazon Technologies, Inc., Seattle, WA (US)

(*) Notice: Subject to any disclaimer, the term of this patent is extended or adjusted under 35 U.S.C. 154(b) by 0 days.

(21) Appl. No.: 16/845,689

(22) Filed: Apr. 10, 2020

(51) Int. Cl.
| | |
|---|---|
| *H05K 1/18* | (2006.01) |
| *H01Q 9/04* | (2006.01) |
| *H05K 1/14* | (2006.01) |
| *H05K 1/02* | (2006.01) |
| *H05K 1/11* | (2006.01) |
| *H01Q 3/26* | (2006.01) |

(52) U.S. Cl.
CPC ......... *H01Q 9/0457* (2013.01); *H01Q 9/0428* (2013.01); *H05K 1/0222* (2013.01); *H05K 1/115* (2013.01); *H05K 1/144* (2013.01); *H01Q 3/26* (2013.01)

(58) Field of Classification Search
CPC ...... H01Q 9/0457; H01Q 9/0428; H01Q 3/26; H05K 1/0222; H05K 1/115; H05K 1/144

USPC .................................................. 343/700 R
See application file for complete search history.

(56) References Cited

U.S. PATENT DOCUMENTS

| | | | | |
|---|---|---|---|---|
| 2014/0302888 | A1* | 10/2014 | Syal | H04M 1/0256 455/552.1 |
| 2015/0364829 | A1* | 12/2015 | Tong | G01S 7/03 342/175 |

\* cited by examiner

*Primary Examiner* — Binh B Tran
(74) *Attorney, Agent, or Firm* — Lowenstein Sandler LLP

(57) ABSTRACT

Technologies directed to vertical coupling structures for antenna feeds of phased array antennas are described. One circuit board includes a first layer with a first portion of a RF coupling structure, a second layer with a second portion of the RF coupling structure, and a first insulation layer located between the first layer and the second layer. The RF coupling structure is configured to electromagnetically couple a first conductive trace on the first layer and a second conductive trace on the second layer at RF frequencies. The circuit board also includes a third layer with a first antenna element and a second insulation layer located between the third layer and the first layer, the second insulation layer including a first via through which the first antenna element is coupled to the first conductive trace.

20 Claims, 12 Drawing Sheets

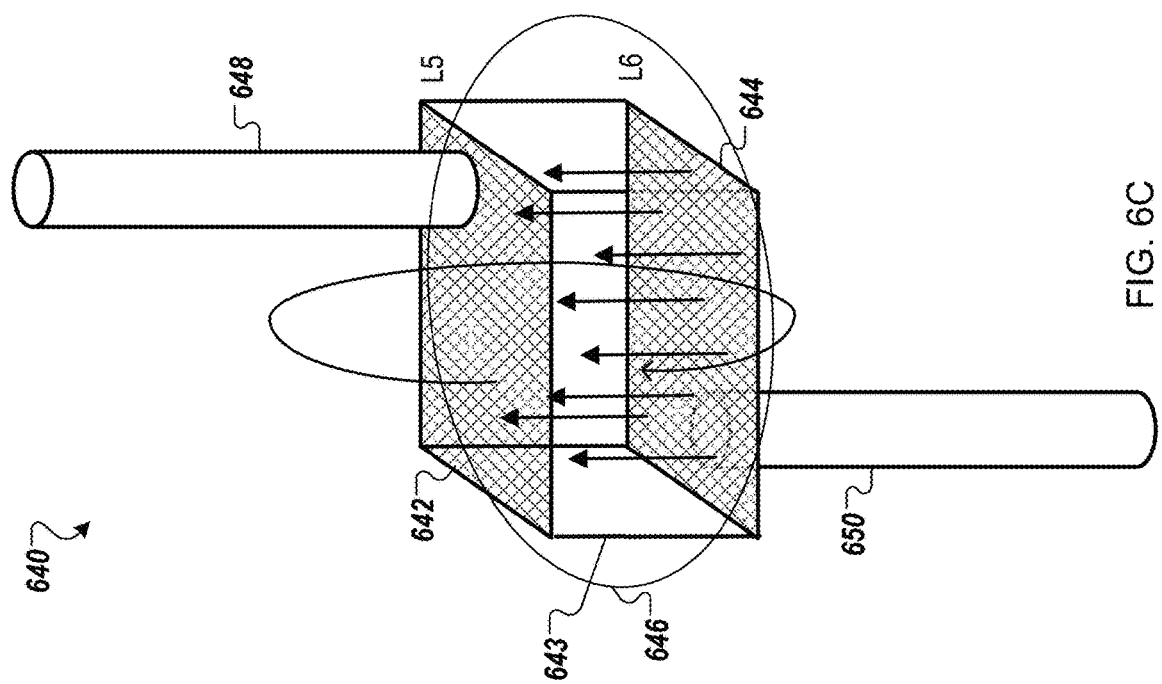
FIG. 6C
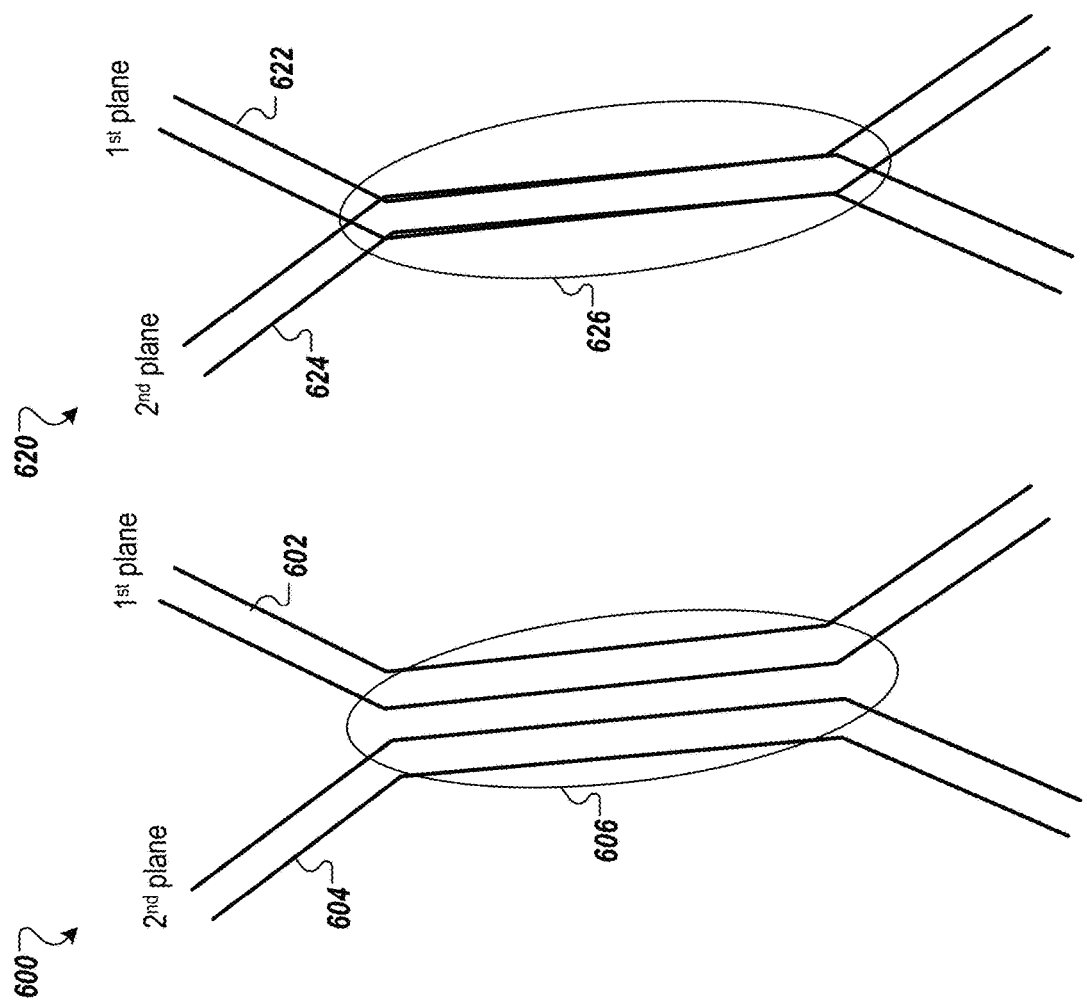
FIG. 6B
FIG. 6A

VERTICAL COUPLING STRUCTURE FOR ANTENNA FEEDS

BACKGROUND

A large and growing population of users is enjoying entertainment through the consumption of digital media items, such as music, movies, images, electronic books, and so on. The users employ various electronic devices to consume such media items. Among these electronic devices (referred to herein as endpoint devices, user devices, clients, client devices, or user equipment) are electronic book readers, cellular telephones, Personal Digital Assistants (PDAs), portable media players, tablet computers, netbooks, laptops, and the like. These electronic devices wirelessly communicate with a communications infrastructure to enable the consumption of the digital media items. In order to communicate with other devices wirelessly, these electronic devices include one or more antennas.

BRIEF DESCRIPTION OF DRAWINGS

The present inventions will be understood more fully from the detailed description given below and from the accompanying drawings of various embodiments of the present invention, which, however, should not be taken to limit the present invention to the specific embodiments, but are for explanation and understanding only.

FIG. 6A illustrates a top view of a vertical coupling structure according to one embodiment.

FIG. 6B illustrates a top view of a vertical coupling structure according to another embodiment.

FIG. 6C illustrates a vertical coupling structure according to another embodiment.

DETAILED DESCRIPTION

Figure 1:
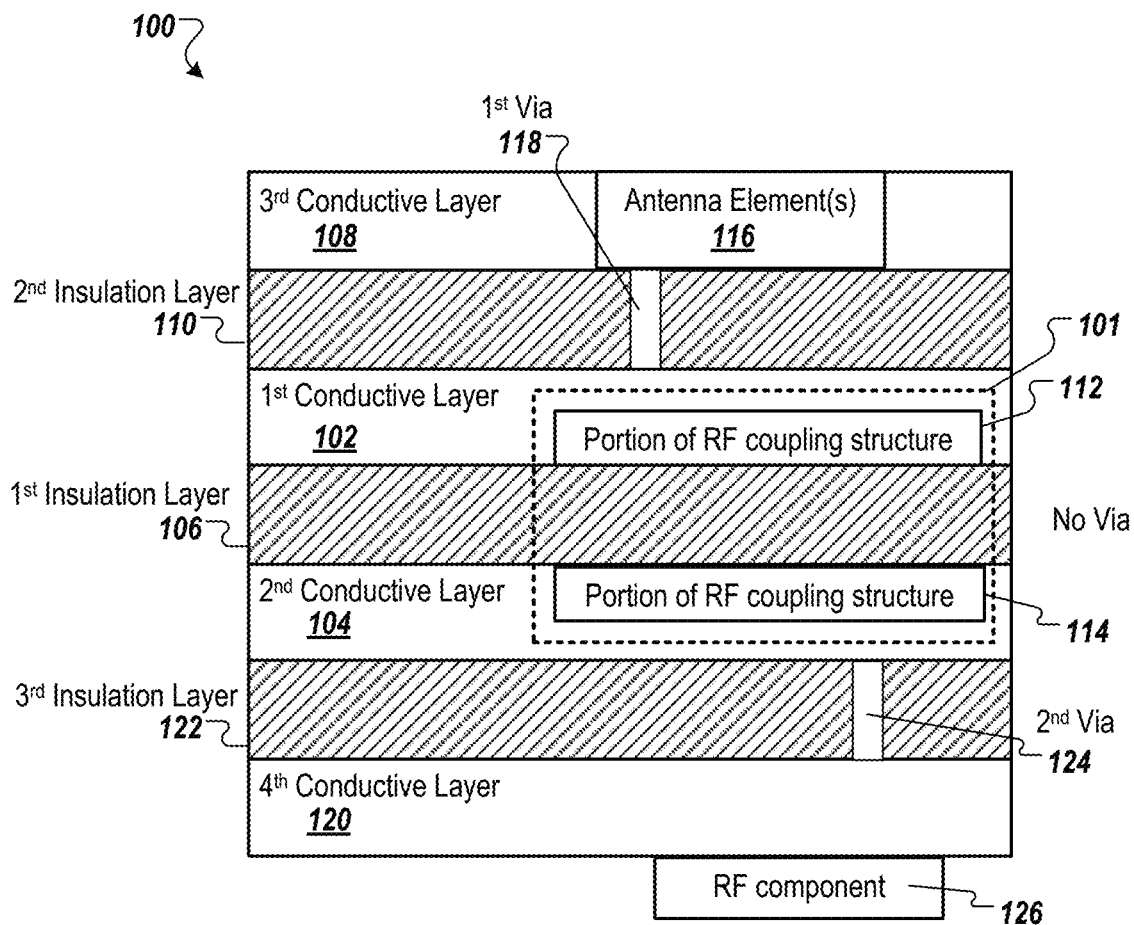
FIG. 1 illustrates a printed circuit board (PCB) with a stack of layers with vertical coupling structures for antenna feeds according to one embodiment.

Technologies directed to vertical coupling structures for antenna feeds of phased array antennas are described. Conventionally, wireless device that have phased array antennas require complex printed circuit boards (PCBs). The PCB includes many layers and are manufactured using at least five lamination cycles to accommodate routing lines for antenna feeds for all of the elements of the phased array antenna. In particular, a key driver for PCB complexity is the needs to have vias interconnecting different combinations of layers to connect antenna elements and RF distribution layers. In addition to requiring five or more lamination cycles, the PCB can include serval permutations of interconnects between layers as well. The complexity of the PCB designs can increase the costs of the PCB and the overall cost of the device containing a circuit board for the phased array antenna.

Aspects of the present disclosure overcome the deficiencies of conventional wireless device by providing vertical coupling structures that electromagnetically couple RF signals between layers. Aspects of the present disclosure can simplify the manufacturing process and reduce the cost of manufacturing as compared to conventional PCBs. Aspects of the present disclosure can provide a circuit board with one or more antenna layers that are not directly connected to the rest of the layers of the circuit board. The vertical coupling structures can electromagnetically couple a group of one or more layers to another group of one or more layers as described herein. One circuit board includes a first conductive layer with a first portion of a RF coupling structure, a second conductive layer with a second portion of the RF coupling structure, and a first insulation layer located between the first conductive layer and the second conductive layer. The RF coupling structure is configured to electromagnetically couple a first conductive trace on the first conductive layer and a second conductive trace on the second conductive layer at RF frequencies. There is no conducted connection, such as with vias, between the first conductive layer and the second conductive layer. The circuit board also includes a third conductive layer with a first antenna element and a second insulation layer located between the third conductive layer and the first conductive layer, the second insulation layer including a first via through which the first antenna element is coupled to the first conductive trace. An antenna element is an antenna element that is coupled to a signal source, such as a radio or a microwave source. It should be noted that although described above as a single feed per element, in other embodiments, each feed can be a multi-point feed, such as dual-point feed, a quad-point feed, or the like.

Additional aspects of the present disclosure overcome the deficiencies of conventional wireless device by providing an RF shielding structure. The RF shielding structure can be an electromagnetically coupled shielded structure. At RF frequencies, two sections (also referred to herein as sub-stacks) (antenna section to RF and digital section) are electromagnetically connected. The RF circuits typically have fences of grounding vias to prevent parasitic coupling, i.e., shield one circuit from another. The electromagnetically coupled PCB sections cannot have grounding vias directly connecting the layers. Thus, the aspects of the present disclosure provide a RF shielding structure with a set of partial vias and pads that each act as a series capacitor for grounding. The series capacitor can be designed to look like a short circuit at RF frequencies. The RF shielding structure completes the grounding via connection, enabling RF shielding between electromagnetically coupled PCB layers at RF frequencies. One circuit board includes: a first layer including a first portion of a RF coupling structure; a second layer including a second portion of the RF coupling structure; a first insulation layer located between the first layer and the second layer; a third layer including a first antenna element; a second insulation layer located between the third layer and the first layer; and an RF shielding structure coupled to a ground connection on the second layer and located in the first insulation layer. The RF coupling structure is configured to electromagnetically couple a first conductive trace on the first layer and a second conductive trace on the second layer at RF frequencies. The RF shielding structure is configured to operate as a RF short circuit between the ground connection and a third conductive trace on the first layer at RF frequencies.

FIG. 1 illustrates a printed circuit board PCB 100 with a stack of layers with vertical coupling structures for antenna feeds according to one embodiment. The PCB 100 includes a first layer 102, a second layer 104, a first insulation layer 106, a third layer 108, and a second insulation layer 110. The first layer 102 is a conductive layer and includes a first portion 112 of a RF coupling structure 101. The second layer 104 is a conductive layer and includes a second portion 114 of the RF coupling structure 101. The first insulation layer 106 is located between the first layer 102 and the second layer 104. The RF coupling structure 101 is configured to electromagnetically couple a first set of conductive traces (not illustrated in FIG. 1) on the first layer 102 and a second set of conductive traces (not illustrated in FIG. 1) on the second layer 104 at RF frequencies. The third layer includes a set of one or more antenna elements 116. The second insulation layer 110 is located between the third layer 108 and the first layer 102. The second insulation layer 110 includes a first set of one or more vias through which the antenna elements 116 is coupled to the first set conductive traces.

In a further embodiment, as illustrated in FIG. 1, the PCB 100 further includes a fourth layer 120 and a third insulation layer 122. The fourth layer 120 is a conductive layer and includes comprising a third set of conductive traces (not illustrated in FIG. 1). The third insulation layer 122 is located between the second layer 104 and the fourth layer 120. The third insulation layer 122 includes a second set of vias 124 that is coupled between the second set of conductive traces and the third set of conductive traces. The third set of conductive traces is coupled to one or more RF components 126 that are disposed on a surface of the PCB 100.

In one example, a first antenna element in the third layer 108 is coupled to a first conductive trace in the first layer 102 through a first via in the second insulation layer. The first conductive trace is electromagnetically coupled to a second conductive trace in the second layer 104 via the RF coupling structure 101. That is, the first conductive trace is coupled to the first portion 112 of the RF coupling structure 101 that is electromagnetically coupled to the second portion 114 of the RF coupling structure 101, the second portion 114 being coupled to the second conductive trace in the second layer 104. The second conductive trace in the second layer 104 is coupled to a third conductive trace in the fourth layer 120 through one of the second set of vias 124 in the third insulation layer 122. The third conductive trace in the fourth layer 120 is coupled to a terminal of a RF component disposed on a surface of the PCB 100.

In another example, a second antenna element in the third layer 108 is coupled to a fourth conductive trace in the first layer 102 through a third via in the second insulation layer. The fourth conductive trace is electromagnetically coupled to a fifth conductive trace in the second layer 104 via a second RF coupling structure. That is, the fourth conductive trace is coupled to a first portion of the second RF coupling structure that is electromagnetically coupled to a second portion of the second RF coupling structure, the second portion being coupled to the fifth conductive trace in the second conductive layer 104. The fifth conductive trace in the second layer 104 is coupled to a sixth conductive trace in the fourth layer 120 through a fourth via in the third insulation layer 122. The fifth conductive trace in the fourth layer 120 is coupled to a terminal of a RF component disposed on a surface of the PCB 100.

In a further embodiment, the PCB 100 includes two sub-stacks. The first layer 102, the third layer 108, and the second insulation layer 110 are part of a first sub-stack that is laminated together in a first lamination cycle. The second layer 104, the fourth layer 120, and the third insulation layer 122 are part of a second sub-stack that is laminated together in a second lamination cycle. The first sub-stack and the second sub-stack are laminated together in a third lamination cycle after the first lamination cycle and after the second lamination cycle. In another embodiment, the first layer 102, the third layer 108, and the second insulation layer 110 are part of a first sub-stack. The second layer 104 is part of a second sub-stack. The second sub-stack can further includes one or more additional conductive layers, one or more additional insulation layers, and one or more sets of vias, each set of vias connecting at least two of the additional conductive layers through one or more of the additional insulation layers.

In a further embodiment, the first sub-stack includes five conductive layers, a first solder mask, and four insulation layers, the second sub-stack includes five conductive layers, a second solder mask, and four insulation layers, a first set of through-hole vias that pass through the five conductive layers and the four insulation layers of the second sub-stack. Similarly, the first sub-stack can include a single set of through-hole vias that pass through the five conductive layers and the four insulation layers of the first sub-stack. In another embodiment, the second sub-stack can include one or more additional conductive layers and one or more additional insulation layers. A second set of through-hole vias pass through the second layer, the five conductive layers, the additional conductive layers, and the insulation layers. In further embodiments, a set of microvias that pass through two of the conductive layers are possible. Additional details of circuit boards with multiple sets of vias and microvias are described below with respect to FIGS. 4-5.

Figure 2:
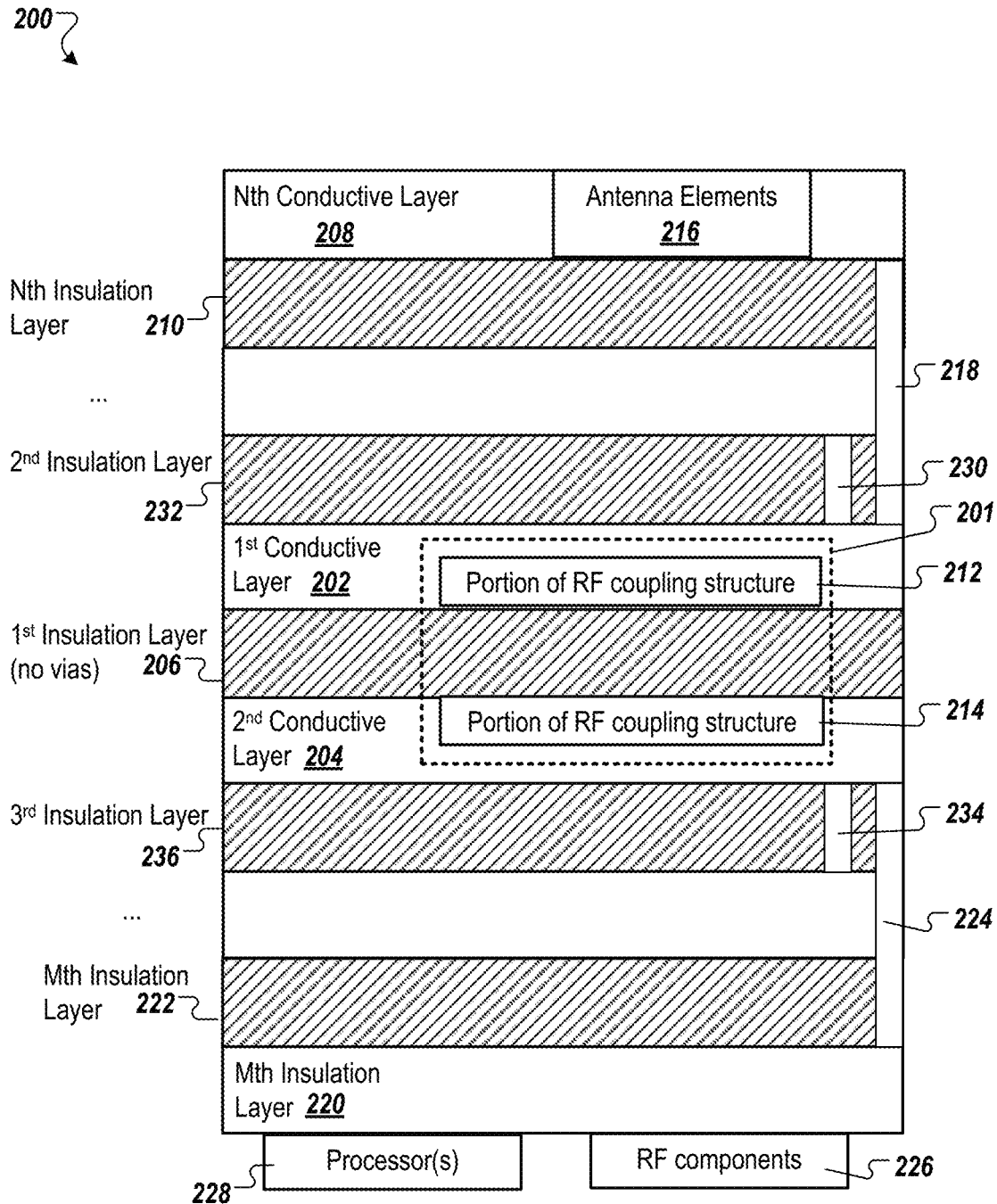
FIG. 2 illustrates a PCB with a stack of layers with vertical coupling structures for antenna feeds according to another embodiment.

FIG. 2 illustrates a PCB 200 with a stack of layers with vertical coupling structures for antenna feeds according to another embodiment. The PCB 200 includes a first conductive layer 202, a second conductive layer 204, a first insulation layer 206, an Nth conductive layer 208, and a Nth insulation layer 210. The first conductive layer 202 includes a first portion 212 of a RF coupling structure 201. The second conductive layer 204 includes a second portion 214 of the RF coupling structure 201. The first insulation layer 206 is located between the first conductive layer 202 and the second conductive layer 204. The RF coupling structure 201 is configured to electromagnetically couple a first set of conductive traces (not illustrated in FIG. 2) on the first conductive layer 202 and a second set of conductive traces (not illustrated in FIG. 2) on the second conductive layer 204 at RF frequencies. The Nth conductive layer 208 includes a set of one or more antenna elements 216. The Nth insulation layer 210 is located between the Nth conductive layer 208 and the first conductive layer 202. The Nth insulation layer 210 includes a first set of one or more vias 218 through which the antenna elements 216 is coupled to the first set conductive traces, which each is coupled to the first portion 212 of the RF coupling structure 201.

As illustrated in FIG. 2, the PCB 200 also includes a Mth conductive layer 220 and a Mth insulation layer 222. The Mth conductive layer 220 is a conductive layer and includes comprising a third set of conductive traces (not illustrated in FIG. 2). The Mth insulation layer 222 is located between the second conductive layer 204 and the Mth conductive layer 220. The Mth insulation layer 222 includes a second set of vias 224 that is coupled between the second set of conductive traces and the third set of conductive traces. The third set of conductive traces is coupled to one or more RF components 226 or one or more processors 228 that are disposed on a surface of the PCB 200.

As illustrated in FIG. 2, there can be one or more intervening conductive layers and one or more intervening insulation layers (e.g., 232) between the Nth conductive layer 208 and the first conductive layer 202. There can also be additional sets of vias between these layers. For example, a second insulation layer 232 includes a third set of vias 230 between two or more conductive layers. Similarly, there can be one or more intervening conductive layers and one or more intervening insulation layers (e.g., 236) between the Mth conductive layer 220 and the second conductive layer 204. There can also be additional sets of vias between these layers. For example, a third insulation layer 236 includes a fourth set of vias 234 between two or more conductive layers.

In one embodiment, the Nth conductive layer 208 includes multiple antenna elements of a phased array antenna. The Nth conductive layer 208 is located on a first side of the PCB 200. The one or more processors 228 and the one or more RF components 226 are located on a second side of the PCB 200. The first conductive layer 202 includes a first set of conductive traces and a first set of vias, each coupling one of the antenna elements to one of the first set of conductive traces through the second insulation layer 232. The second conductive layer 204 includes a second set of conductive traces. A set of one or more vertical coupling structures (e.g., 201) are located in the first insulation layer 206. Each of the vertical coupling structures includes i) a first portion 212 located in the first conductive layer 202 and is coupled to one of the first set of conductive traces and ii) a second portion 214 located in the second conductive layer 204 and is coupled to one of the second set of conductive traces. Each via of a second set of vias is couples one of the second set of conductive traces to at least one of the processors 228 or the RF components 226. The RF components 226 can be RF components of RF front-end (RFFE) circuitry of one or more radios coupled to the antenna elements of the phased array antenna. An antenna element is an antenna element that is coupled to a signal source, such as a radio or a microwave source. It should be noted that although described above as a single feed per element, in other embodiments, each feed can be a multi-point feed, such as dual-point feed, a quad-point feed, or the like.

In one embodiment, the PCB 200 includes antenna elements of multiple phased array antennas, such as a first phased array antenna and a second phased array antenna. The first phased array antenna can be configured to operate at a first frequency range (e.g., 30 GHz frequency band) and the second phased array antenna is configured to operate at a second frequency range (proportional to a wavelength corresponding to the second frequency range (e.g., 20 GHz frequency band). In one embodiment, the first frequency range is between approximately 27.5 GHz and approximately 31 GHz. In one embodiment, the second frequency range is between approximately 18.3 GHz and approximately 20.2 GHz. Alternatively, other frequency ranges can be used.

Figure 3:
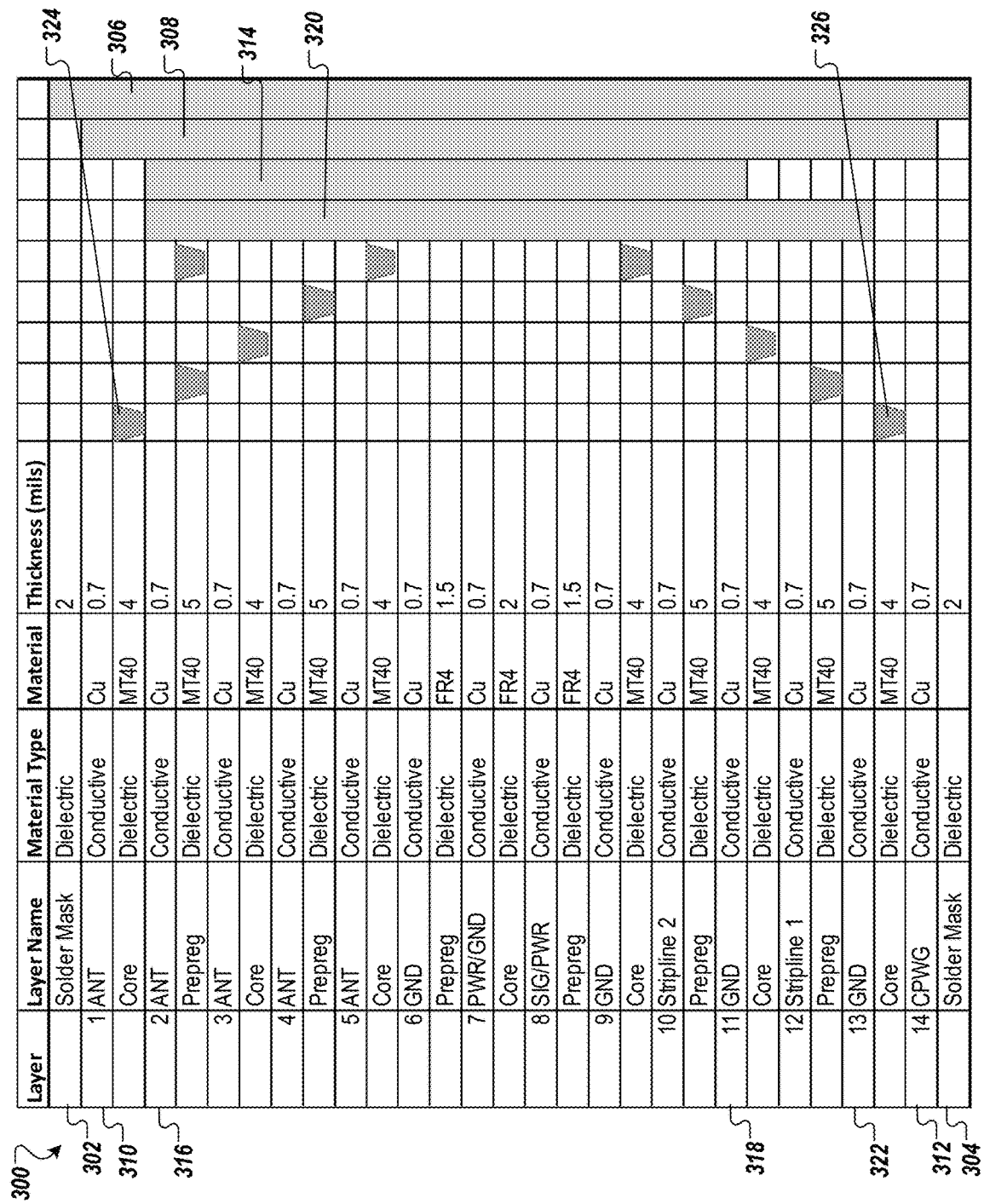
FIG. 3 illustrates a PCB with a stack of layers with multiple vias and without vertical coupling structures according to one implementation.

FIG. 3 illustrates a PCB 300 with a stack of layers with multiple vias and without vertical coupling structures according to one implementation. The PCB 300 includes fourteen conductive layers, a first solder mask 302, and a second solder mask 304. Between each of these layers are insulation layers. To accommodate connections between antenna elements and the RF components or processors, the PCB 300 includes at least 4 sets of vias. A first set of vias 306 is located between the first solder mask 302 and the second solder mask 304. A second set of vias 308 is located between a first antenna layer 310 and a conductive layer 312. A third set of vias 314 is located between a second antenna layer 316 and a ground layer 318. A fourth set of vias 320 is located between the second antenna layer 316 and a ground layer 322. The PCB 300 also include various microvias that are disposed between two layers, such as a first microvia 324 between the first antenna layer 310 and the second antenna layer 316 and a second microvia 326 between the conductive layer 312 and the ground layer 322. In some cases, an insulation layer can include more than one microvia. Given the number of sets of vias 306, 308, 314, and 320, the PCB 300 requires five or more lamination cycles.

Figure 4:
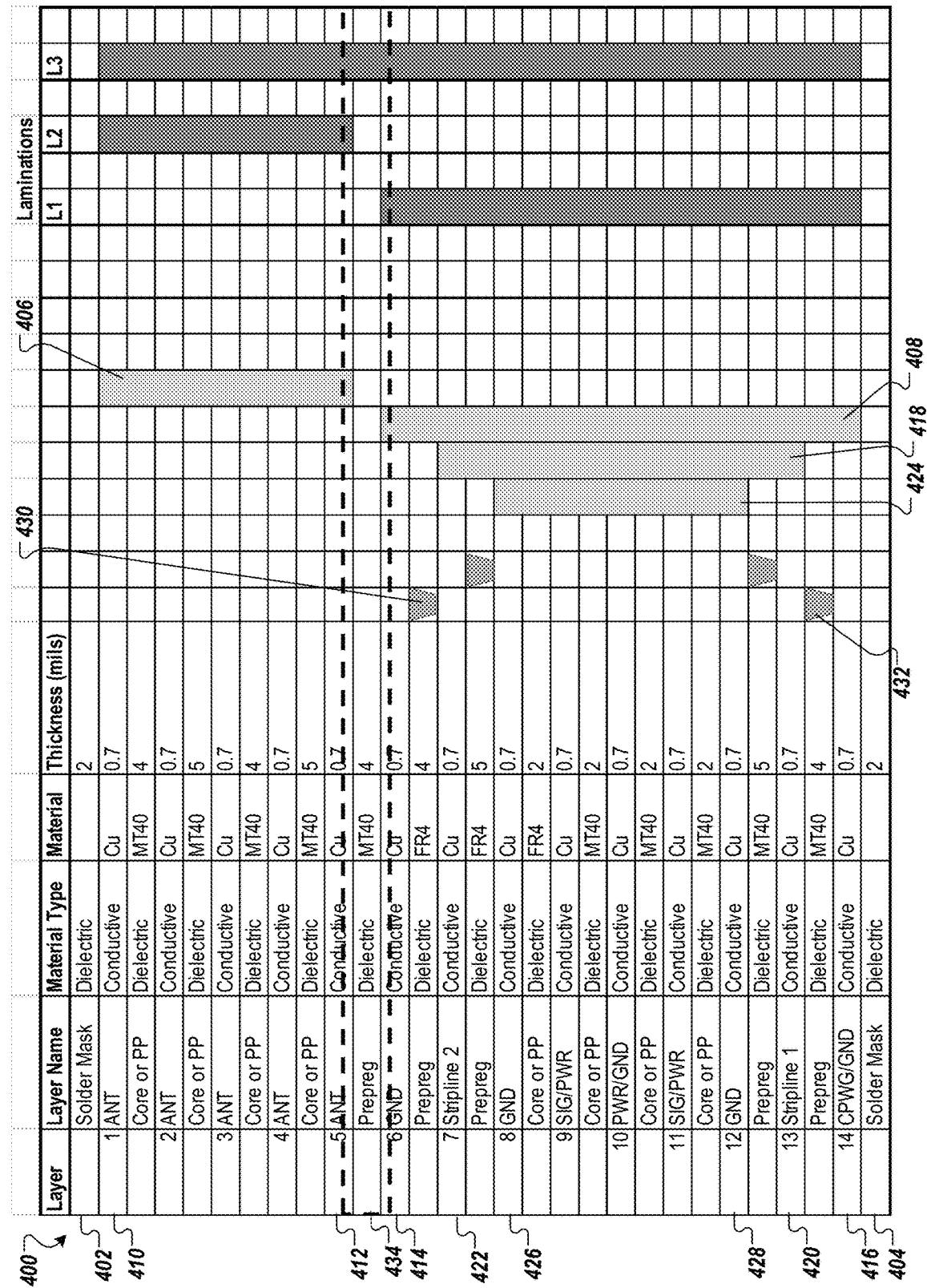
FIG. 4 illustrates a PCB with a stack of layers with vertical coupling structures for antenna feeds according to another embodiment.

FIG. 4 illustrates a PCB 400 with a stack of layers with vertical coupling structures for antenna feeds according to another embodiment. The PCB 400 includes fourteen conductive layers, a first solder mask 402, and a second solder mask 404. Between each of these layers are insulation layers. To accommodate connections between antenna elements and the RF components or processors, the PCB 400 includes only 4 sets of vias. A first set of vias 406 is located between the first solder mask 402 and a fifth antenna layer 412. The first solder mask 402 and the five antenna layers are part of a first sub-stack that is laminated during a second lamination cycle (L2). A second set of vias 408 is located between a first ground layer 414 and a conductive layer 416. A third set of vias 418 is located between a first strip line layer 420 and a second strip line layer 422. A fourth set of vias 424 is located between a ground layer 426 and a ground layer 428. The second solder mask 404 and the nine conductive layers are part of a second sub-stack that is laminated during a first lamination cycle (L1). The PCB 400 also include various microvias that are disposed between two layers, such as a first microvia 430 between the first ground layer 414 and the second strip line layer 422 and a second microvia 432 between the first strip line layer 420 and the conductive layer 416. After the second lamination cycle (L2) of the first sub-stack and the first lamination cycle (L1) of the second sub-stack, the first sub-stack and the second sub-stack are laminated with an intervening insulation layer 434 in a third lamination cycle (L3).

Figure 5:
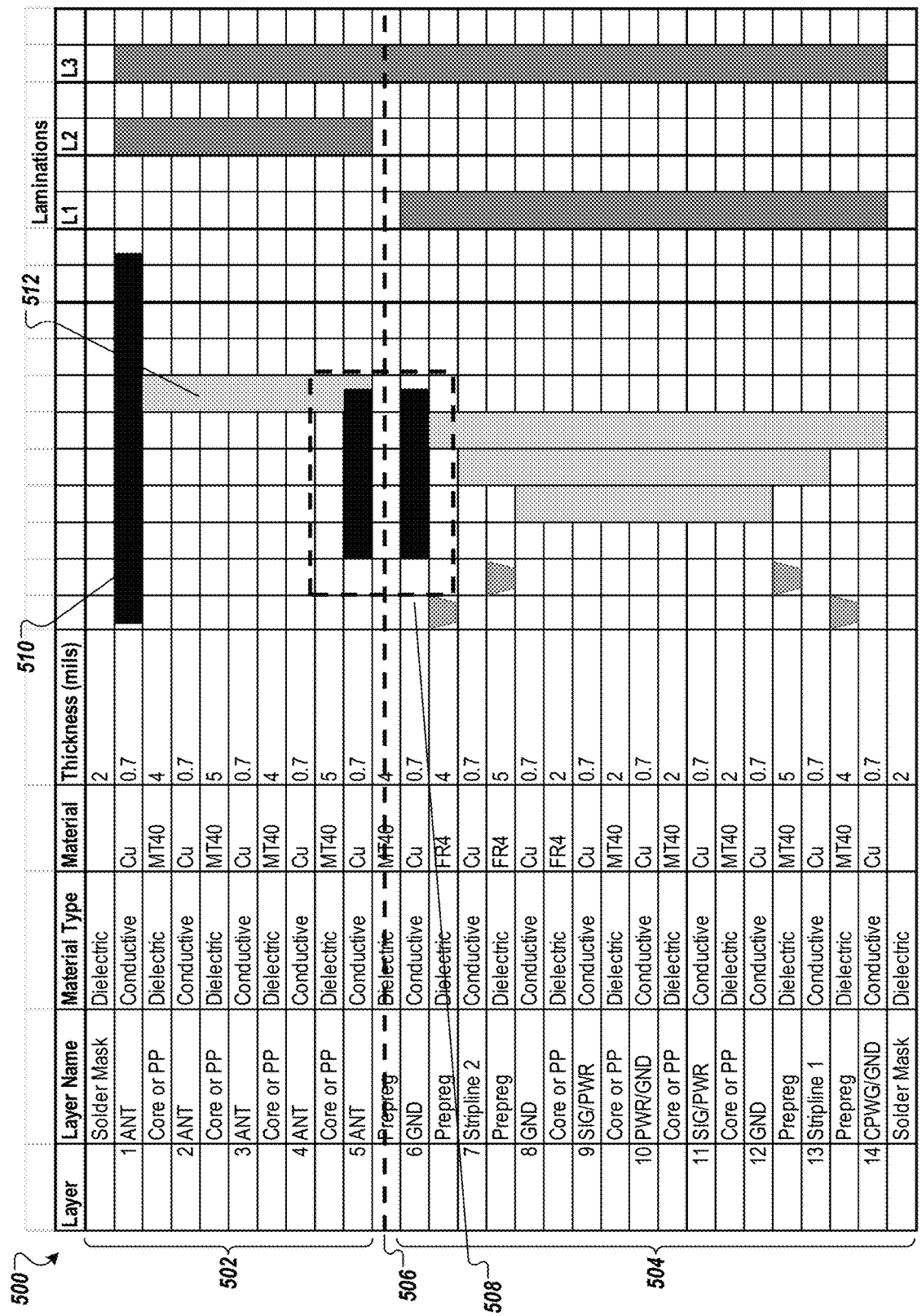
FIG. 5 illustrates a PCB with a stack of layers with vertical coupling structures that are manufactured in three lamination cycles according to another embodiment.

FIG. 5 illustrates a PCB 500 with a stack of layers with vertical coupling structures that are manufactured in three lamination cycles according to another embodiment. The PCB 500 includes a first sub-stack 502, a second sub-stack 504, and a first insulation layer 506 between the first sub-stack 502 and the second sub-stack 504. The second sub-stack 504 is laminated in a first lamination cycle (L1). The first sub-stack 502 is laminated in a second lamination cycle (L2).

The first sub-stack 502 includes antenna elements 510 in a first antenna layer. In order to connect the antenna elements 510 to other circuits, such as RF components, processors, radios, or the like, a vertical coupling structure 508 is used between the first sub-stack 502 and the second sub-stack 504. The other circuits may include RF circuits, digital circuits, power circuits, controllers, or the like. A first portion of the vertical coupling structure 508 is part of a fifth layer of the first sub-stack 502 and a second portion of the vertical coupling structure 508 is part of a first layer of the second sub-stack 504. The vertical coupling structure 508 can include multiple sub-structures to form individual connections between individual elements of the antenna elements 510 to specific connection points of the other circuits. For example, the vertical coupling structure 508 includes a set of RF couplers, where each RF coupler connects to the individual antenna elements 510 through a via of a first set of vias 512 between the first conductive layer and the fifth antenna layer. The RF coupler connection between PCB layers are not directly connected (conductively connected), but are electromagnetically coupled at RF frequencies. The RF coupler can enable circular polarization as well. Alternatively, the individual antenna elements 510 can be connect to an individual RF coupler through any feed mechanism with or without the use of the first set of vias 512.

In order to connect the antenna elements to RF components or processor disposed on the circuit board, one or more vertical coupling structures are formed between the first sub-stack 502 and the second sub-stack 504. For example, each of the vertical coupling structure electromagnetically couple a RF signal between a conductive trace in the first sub-stack 502 and a second conductive trace in the second sub-stack 504. The conductive traces in the second sub-stack 504 can be coupled to the other circuits disposed on the second side of the PCB 500.

In one embodiment, the RF couplers of the vertical coupling structure 508 can be one or more quadrature hybrid couplers. A quadrature hybrid coupler can convert RF signals with a linear polarization to RF signals with a circular polarization. The quadrature hybrid coupler can be used to provide a circular polarization over a wide bandwidth. By building the quadrature hybrid coupler on two different layers, the same structure can be used to obtain wideband circular polarization as well as to electromagnetically connect the antenna layers (top layers) to circuits on the bottom layers of the PCB. This could enable simultaneous dual circularly polarized beams on an antenna or an array of antenna elements on the PCB. This PCB would be a reduced-cost PCB. Additional structures can couple to the antenna feeds, including parallel plate capacitors and other types of couplers, as described herein. Additional details of the quadrature hybrid coupler are described below with respect to FIGS. 6D-6E.

FIG. 6A illustrates a top view of vertical coupling structure 600 according to one embodiment. The vertical coupling structure 600 includes a first conductive trace 602 in a first plane (e.g., a first conductive layer) and a second conductive trace 604 in a second plane (e.g., a second conductive layer that is separated from the first conductive layer by an insulation layer). The first conductive trace 602 and the second conductive trace 604 can be located to form a RF coupling 606. That is, an RF signal on the first conductive trace 602 can be electromagnetically coupled to the second conductive trace 604. Similarly, an RF signal on the second conductive trace 604 can be electromagnetically coupled to the first conductive trace 602. In this embodiment, the first conductive trace 602 and the second conductive trace 604 are disposed on separate layers, but also do not overlap in a vertical axis, such as illustrated in the vertical coupling structure of FIG. 6B.

FIG. 6B illustrates a top view of a vertical coupling structure 620 according to another embodiment. The vertical coupling structure 620 includes a first conductive trace 622 in a first plane (e.g., a first conductive layer) and a second conductive trace 624 in a second plane (e.g., a second conductive layer that is separated from the first conductive layer by an insulation layer). The first conductive trace 622 and the second conductive trace 624 can be located to form a RF coupling 626. That is, an RF signal on the first conductive trace 622 can be electromagnetically coupled to the second conductive trace 624. Similarly, an RF signal on the second conductive trace 624 can be electromagnetically coupled to the first conductive trace 622. In this embodiment, the first conductive trace 622 and the second conductive trace 604 are disposed on separate layers but are disposed to overlap in the vertical axis.

FIG. 6C illustrates a vertical coupling structure 640 according to another embodiment. The vertical coupling structure 640 includes a first conductive trace 642 in a first plane (e.g., a first conductive layer) and a second conductive trace 644 in a second plane (e.g., a second conductive layer). The first conductive trace 642 is separated by the second conductive trace 644 that is separated by an insulation layer 643. The first conductive trace 642 and the second conductive trace 644 can be located to form a RF coupling 646. That is, an RF signal on the first conductive trace 642 can be electromagnetically coupled to the second conductive trace 644. Similarly, an RF signal on the second conductive trace 644 can be electromagnetically coupled to the first conductive trace 642. In this embodiment, the first conductive trace 642 and the second conductive trace 644 are disposed on separate layers and are disposed to overlap in the vertical axis. For an example, an RF signal on the second conductive trace 644 causes an electric field (E field) between the first conductive trace 642 and the second conductive trace 644 through the insulation layer 643. The RF signal also causes a magnetic field (H field) as well. The RF signal electromagnetically couples between the second conductive trace 644 and the first conductive trace 642 without using a via in the insulation layer 643. The first conductive trace 642 can be coupled to a first via 648 to couple to a conductive trace or antenna element on another layer. The second conductive trace 644 can be coupled to a second via 650 to couple to a conductive trace or RF component on another layer. In the depicted embodiment, the first conductive trace 642 is part of the fifth antenna layer (L5) of the PCB 400 of FIG. 4 or the PCB 500 of FIG. 5 and the second conductive trace 644 is part of the sixth layer (L6) (e.g., first ground layer 414 of FIG. 6 or the conductive layer of FIG. 5 having the second portion of the vertical coupling structure 508 of FIG. 5).

Figure 6D:
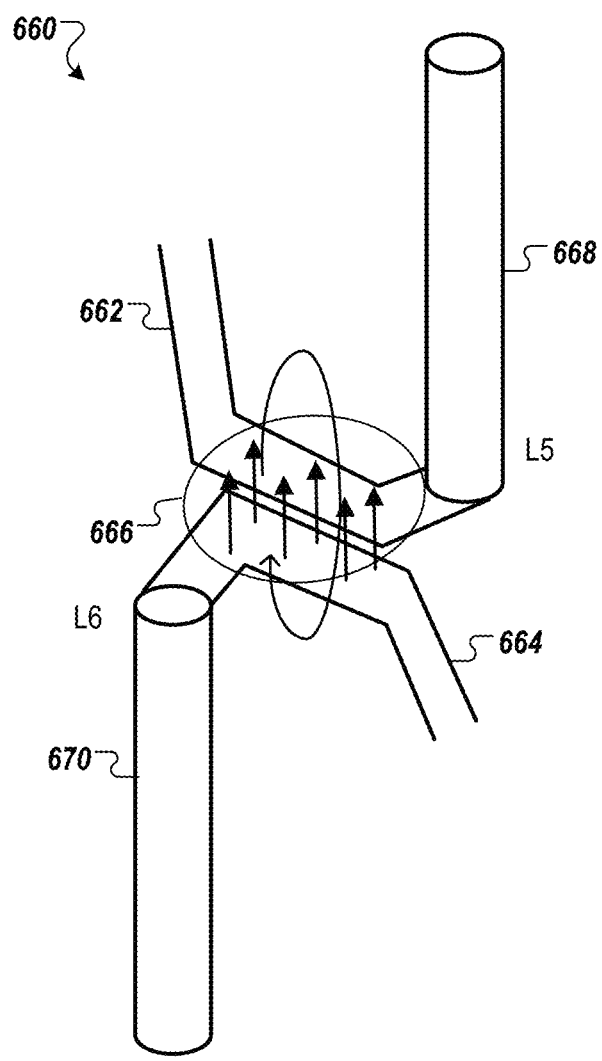
FIG. 6D illustrates a vertical coupling structure according to another embodiment.

FIG. 6D illustrates a vertical coupling structure 660 according to another embodiment. The vertical coupling structure 660 includes a first conductive trace 662 in a first plane (e.g., a first conductive layer) and a second conductive trace 664 in a second plane (e.g., a second conductive layer). The first conductive trace 662 is separated by the second conductive trace 664 that is separated by an insulation layer (not illustrated in FIG. 6). The first conductive trace 662 and the second conductive trace 664 can be located to form a RF coupling 666. That is, an RF signal on the first conductive trace 662 can be electromagnetically coupled to the second conductive trace 664. Similarly, an RF signal on the second conductive trace 664 can be electromagnetically coupled to the first conductive trace 662. In this embodiment, the first conductive trace 662 and the second conductive trace 664 are disposed on separate layers and are disposed to overlap in the vertical axis. For an example, an RF signal on the second conductive trace 664 causes an electric field (E field) between the first conductive trace 662 and the second conductive trace 664 through the insulation layer. The RF signal also causes a magnetic field (H field) as well. The RF signal electromagnetically couples between the second conductive trace 664 and the first conductive trace 662 without using a via in the insulation layer. The first conductive trace 662 can be coupled to a first via 668 to couple to a conductive trace or antenna element on another layer. The second conductive trace 664 can be coupled to a second via 670 to couple to a conductive trace or RF component on another layer. In the depicted embodiment, the first conductive trace 662 is part of the fifth antenna layer (L5) of the PCB 400 of FIG. 4 or the PCB 500 of FIG. 5 and the second conductive trace 664 is part of the sixth layer (L6) (e.g., first ground layer 414 of FIG. 6 or the conductive layer of FIG. 5 having the second portion of the vertical coupling structure 508 of FIG. 5). The first conductive trace 662 and the second conductive trace 664 can overlap in the vertical axis. Alternatively, the first conductive trace 662 and the second conductive trace 664 can be disposed to partially overlap or not overlap at all in the vertical axis.

Figure 6E:
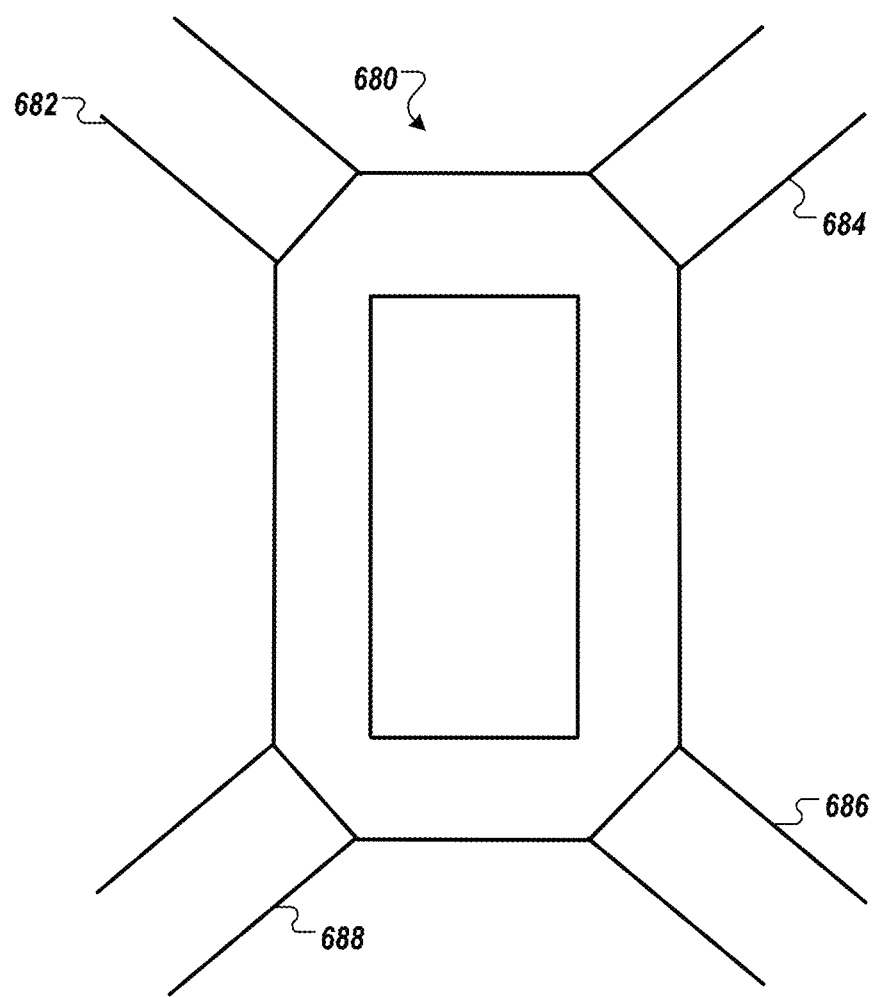
FIG. 6E illustrates a vertical coupling structure that operates as a quadrature hybrid coupler according to one embodiment.

FIG. 6E illustrates a vertical coupling structure that operates as a quadrature hybrid coupler 680 according to one embodiment. The quadrature hybrid coupler 680 includes a conductive structure having four sides, such as a rectangular shape, a square shape, a rounded rectangular shape, a rounded square shape, or the like. Each corner of the quadrature hybrid coupler 680 is coupled to a conductive trace. A first conductive trace 682 is coupled to a first corner of the quadrature hybrid coupler 680. A second conductive trace 684 is coupled to a second corner of the quadrature hybrid coupler 680. A third conductive trace 686 is coupled to a third corner of the quadrature hybrid coupler 680. A fourth conductive trace 688 is coupled to a fourth corner of the quadrature hybrid coupler 680. A second conductive structure of a similar shape can be disposed in a second plane. Any of the four conductive traces can be coupled to a via to connect to another layer of the PCB as described herein.

Figure 6F:
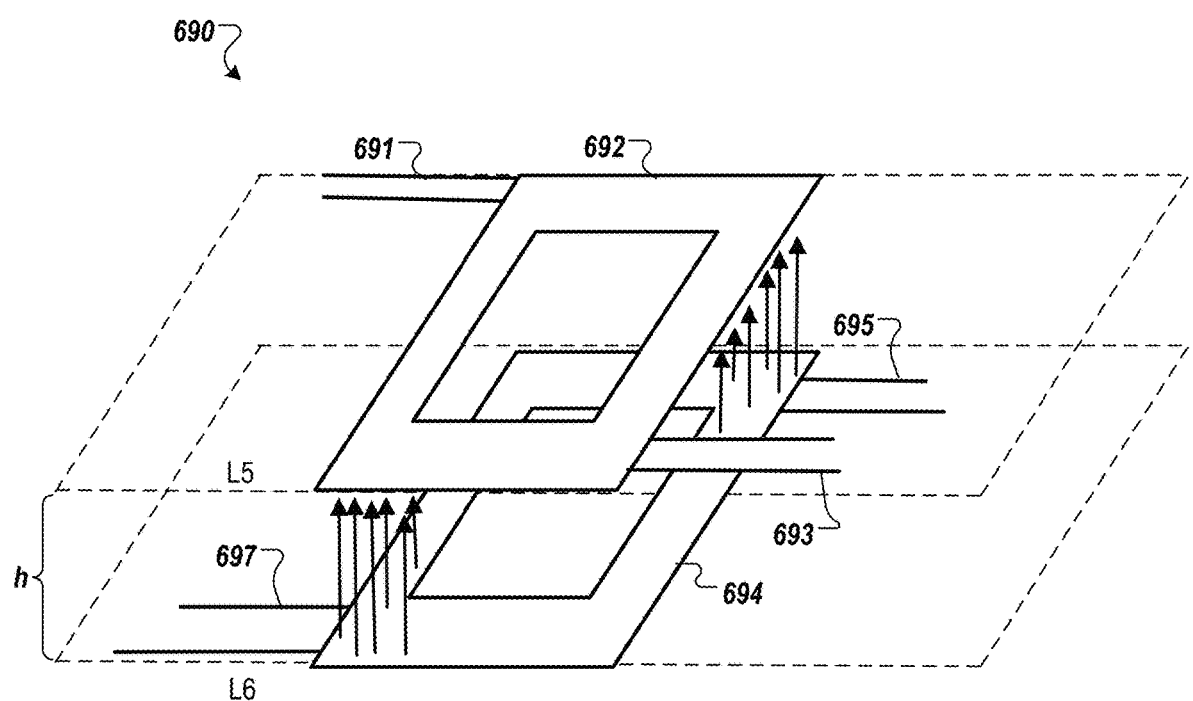
FIG. 6F illustrates a vertical coupling structure that operates as a quadrature hybrid coupler according to one embodiment.

FIG. 6F illustrates a vertical coupling structure that operates as a quadrature hybrid coupler according to one embodiment. The quadrature hybrid coupler 690 includes a first conductive structure 692 in a first layer (e.g., L5) and a second conductive structure 694 in a second layer (L6). Each of the first conductive structure 692 and the second conductive structure 694 can include four sides, such as a rectangular shape, a square shape, a rounded rectangular shape, a rounded square shape, or the like. A first conductive trace 691 is coupled to a first corner of the first conductive structure 692 and a second conductive trace 693 is coupled to a second corner of the first conductive structure 692. The second corner is an opposite corner of the first corner. A third conductive trace 695 is coupled to a first corner of the second conductive structure 694 and a fourth conductive trace 697 is coupled to a second corner of the second conductive structure 694. The second corner is an opposite corner of the first corner. Any of the four conductive traces can be coupled to a via to connect to another layer of the PCB as described herein.

A quadrature hybrid coupler can convert RF signals with a linear polarization to RF signals with a circular polarization. The quadrature hybrid coupler can be used to provide a circular polarization over a wide bandwidth. By building the quadrature hybrid coupler on two different layers, the same structure can be used to obtain wideband circular polarization as well as to electromagnetically connect the antenna layers (top layers) to circuits on the bottom layers of the PCB. This could enable simultaneous dual circularly polarized beams on an antenna or an array of antenna elements on the PCB. This PCB would be a reduced-cost PCB. Additional structures can couple to the antenna feeds, including parallel plate capacitors and other types of couplers, as described herein.

Although FIGS. 1-6 illustrate and described various stacks, the circuit boards can be composed of any number of layers with at least two of the layers electromagnetically coupled. In one embodiment, a wireless device includes a digital signal processor (DSP) and RF components disposed on a second side of a PCB. The PCB includes a stack of layers, including a first sub-stack of layers, a first insulation layer, and a second sub-stack of layers. The first sub-stack of layers includes: i) a first conductive layer having multiple antenna elements located on a first side of the PCB; ii) a second conductive layer having a first set of conductive traces; iii) a second insulation layer located between the first conductive layer and the second conductive layer; and iv) a first set of vias in the second insulation layer, each of the first set of vias connects one of the multiple antenna elements to one of the first set of conductive traces through the second insulation layer. The second sub-stack of layers includes: i) a third conductive layer having a second set of conductive traces; ii) a fourth conductive layer having a third set of conductive traces; iii) a third insulation layer located between the third conductive layer and the fourth conductive layer; and iv) a second set of vias in the third insulation layer, each of the second set of vias connects each of the second set of conductive traces to one of the third set of conductive traces through the third insulation layer. The conductive traces can be considered RF distribution routing traces. The second conductive layer, the first insulation layer, and the third conductive layer form a set of RF couplers that electromagnetically couple the multiple antenna elements to the RF components. In a further embodiment, the first sub-stack of layers are laminated together in a first lamination cycle, the second sub-stack of layers are laminated together in a second lamination cycle, and the stack of layers are laminated together in a third lamination cycle after the first lamination cycle and the second lamination cycle. The set of RF couplers can be formed in the conductive layers using various shapes, sizes of conductive structures. In one embodiment, the set of RF couplers include at least one quadrature hybrid coupler that converts RF signals with a linear polarization to RF signals with a circular polarization.

In another embodiment, a device includes a processor and a RF component disposed on a circuit board. The circuit board includes a first layer with a set of antenna elements of a phased array antenna. The set of antenna elements is located on a first side of the circuit board. The circuit board includes a second layer with a first set of conductive traces, a first set of vias, each coupling one of the set of antenna elements to one of the first set of conductive traces through a first insulation layer, and a third layer with a second set of conductive traces. A second insulation layer is located between the second layer and the third layer. The circuit board also includes a set of vertical coupling structures, each including i) a first portion located in the second layer and coupled to one of the first set of conductive traces and ii) a second portion located in the third layer and coupled to one of the second set of conductive traces. The circuit board also includes a second set of vias, each via coupling one of the second set of conductive traces to at least one of the processor or the RF component. In one embodiment, at least one of the vertical coupling structures is a quadrature hybrid coupler. Alternatively, other vertical coupling structures, such as those described herein, can be used. The vertical coupling structures can electromagnetically couple a first conductive trace on a first layer and a second conductive trace on a second layer at RF frequencies. This can be with no conduction connection. That is, the first insulation layer, through which the first conductive trace and the second conductive trace electromagnetically couple, does not include a via to conductively couple the first conductive trace and the second conductive trace.

In a further embodiment, the circuit board includes a fourth layer with a third set of conductive traces. A third insulation layer is located between the third layer and the fourth layer. Each of the second set of vias is coupled to one of the second set of conductive traces and one of the third set of conductive traces through the third insulation layer. In one embodiment, the first layer, the second layer, and the first insulation layer are laminated together as a first stack in a first lamination cycle. The third layer and the second insulation layer are laminated together in a second stack in a second lamination cycle. The first stack, the first insulation layer, and the second stack are laminated together in a third lamination cycle after the first lamination cycle and the second lamination cycle. In some embodiments, the first stack includes a first solder mask and the second stack includes a second solder mask. In one embodiment, the first set of vias includes a first through-hole via between a top layer of the first stack and a bottom layer of the first stack and the second set of vias includes a second through-hole via between a top layer of the second stack and a bottom layer of the second stack. In this embodiment, there is no via between the first solder mask and the second solder mask.

As described above, the vertical coupling structures can be used to reduce the complexity of the PCB, reduce the number of lamination cycles, and reduce the overall system cost of a phased array antenna system. The embodiments described herein have a simpler manufacturing process for a circuit board with antenna elements than a conventional circuit board. The antenna elements are not directly connected to the rest of the PCB layers. Vias connect a first group of layers (Layer 1 to Layer 5, as illustrated in FIGS. 4-5) on the antenna side of the circuit board. One or more vias connect a second group of layers (Layer 6 to Layer 14, as illustrated in FIGS. 4-5) on the RF circuit side of the circuit board. The vertical coupling structures electromagnetically couple the first group of layers (upper layer group of L1-L5) to the second group of layers (lower layer group of L6-L14).

Figure 7:
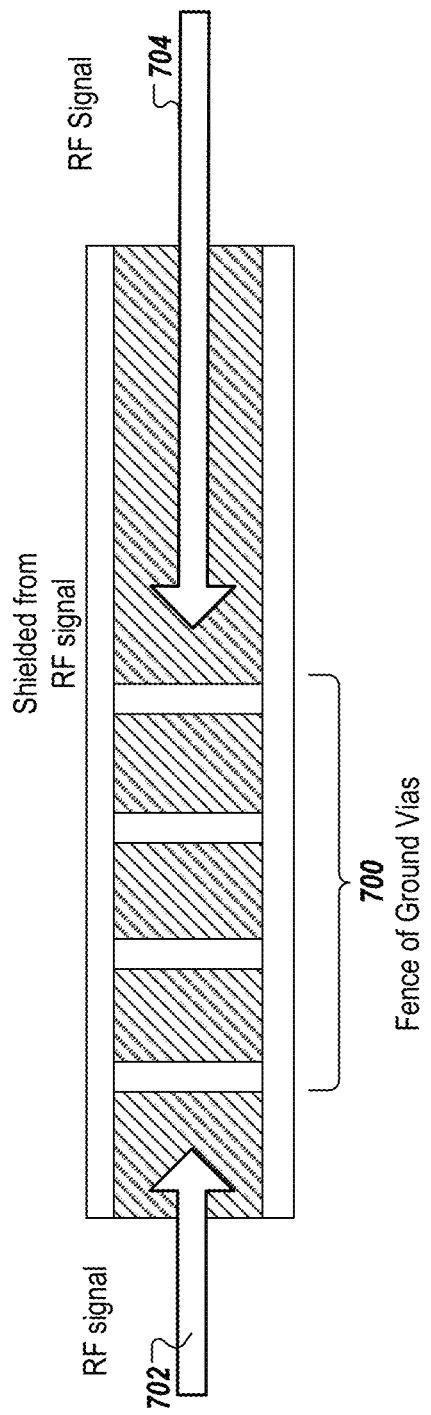
FIG. 7 illustrates multiple ground vias for shielding radio frequency (RF) signals according to one implementation.

At RF frequencies, two sections of a PCB (antenna section and RF/digital section) can be electromagnetically connected using the vertical coupling structure. RF circuits typically have fences of grounding vias to prevent parasitic coupling between RF traces, i.e., shield one circuit from another. If multiple PCB sections are electromagnetically coupled, there cannot be grounding vias that directly connect the layers. FIG. 7 illustrates fences of grounding vias and FIG. 8 illustrates a RF grounding structure used for electromagnetic coupling RF feeds between PCB sections.

FIG. 7 illustrates a fence 700 of multiple ground vias for shielding RF signals according to one implementation. The fence 700 is made up of four ground vias that couple ground traces on a first layer with ground traces on a second layer. The fence 700 of ground vias operate to shield a first RF signal 702 from a second RF signal 704. As noted above, when electromagnetically coupling two layers using a vertical coupling structure, the fence 700 of ground vias cannot be used.

Aspects of the present disclosure provide an RF shielding structure to prevent parasitic coupling between two RF signals. The RF shielding structure can include a set of partial vias and pads that each act as a series capacitor for grounding. The series capacitor can be designed to look like a short circuit at RF frequencies. The RF shielding structure completes the grounding via connection, enabling RF shielding between electromagnetically coupled PCB layers at RF frequencies. An example RF shielding structure is described below with respect to FIG. 8.

Figure 8:
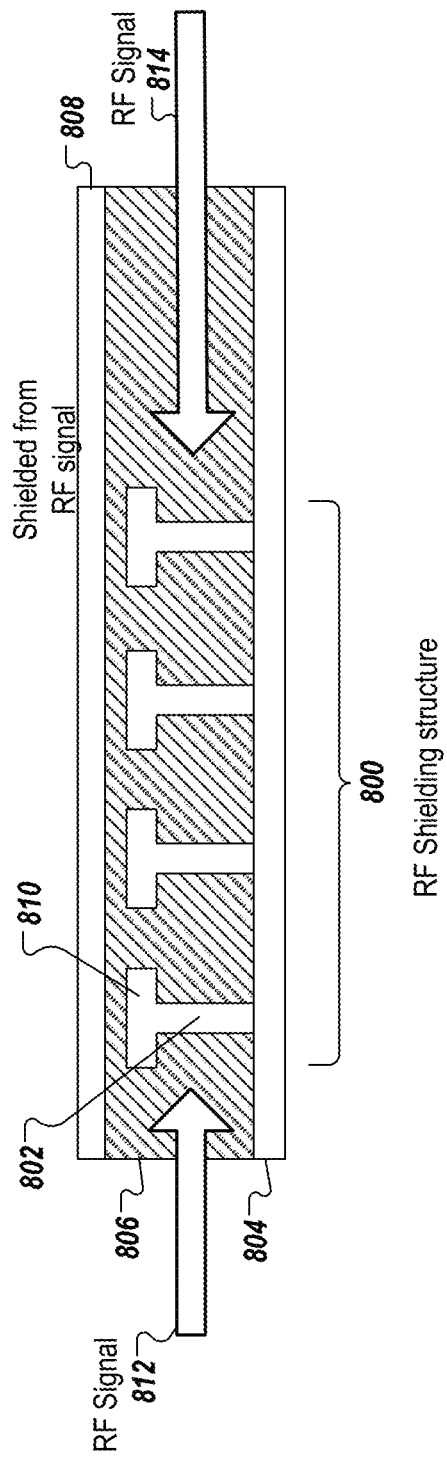
FIG. 8 illustrates an RF shielding structure with multiple parallel plate capacitors for shielding RF signals according to one embodiment.

FIG. 8 illustrates an RF shielding structure 800 with multiple parallel plate capacitors for shielding RF signals according to one embodiment. The RF shielding structure 800 is made up of four parallel plate capacitors in series with a grounding trace. Each of the parallel plate capacitors includes a partial via 802 that extends from a grounding connection on a first layer 804 through an insulation layer 806 towards a second layer 808 and a pad 810 located at a distal end of the partial via 802, the distal end being farther from the first layer 804 and the pad 810 being parallel to the second layer 808. The four parallel plate capacitors are coupled to a ground potential and operate as a RF short circuit to ground connections on the second layer 808 at RF frequencies. The ground connections on the second layer 808 can be coupled to one or more antenna elements on another layer through vias as described herein. The four parallel plate capacitors enable RF shielding between a first RF signal 812 and a second RF signal 814. The RF shielding structure completes the grounding via connection between the antenna elements and the RF components, enabling RF shielding between electromagnetically coupled PCB layers at RF frequencies.

Although illustrated as partial vias and pads, the parallel plate capacitors can be designed in other shapes and sizes to create an RF short circuit at RF frequencies. It should also be noted that other numbers of parallel plate capacitors can be used to create enough RF shielding between the RF signals. Alternatively, other RF shielding structures can be used other than parallel plate capacitors.

In another embodiment, a circuit board includes: a first layer including a first portion of a RF coupling structure; a second layer including a second portion of the RF coupling structure; a first insulation layer located between the first layer and the second layer; a third layer including a first antenna element; a second insulation layer located between the third layer and the first layer; and an RF shielding structure coupled to a ground connection on the second layer and located in the first insulation layer. The RF coupling structure is configured to electromagnetically couple a first conductive trace on the first layer and a second conductive trace on the second layer at RF frequencies. The RF shielding structure is configured to operate as a RF short circuit between the ground connection and a third conductive trace on the first layer at RF frequencies.

In another embodiment, a wireless device includes a DSP and RF components disposed on a PCB having a stack of layers. The stack of layers includes a first sub-stack, an insulation layer (e.g., insulation layer 806), and a second sub-stack of layers. The first sub-stack includes i) a first conductive layer with a set of antenna elements located on a first side of the PCB; ii) a second conductive layer with a first set of conductive traces; iii) a second insulation layer located between the first conductive layer and the second conductive layer; and iv) a first set of vias in the second insulation layer, each of the first set of vias connects one of the set of antenna elements to one of the first set of conductive traces through the second insulation layer. The second sub-stack of layers includes a third conductive layer with a second set of conductive traces. The second conductive layer, the first insulation layer, and the third conductive layer form a set of RF couplers that electromagnetically couple the plurality of antenna elements to the RF components. One of the RF couplers electromagnetically couples the first RF signal 812 between the first layer 804 and the second layer 808. Another one of the RF couplers electromagnetically couples the second RF signal 814 between the first layer 804 and the second layer 808. The RF shielding structure 800 is a set of parallel plate capacitors in series with a first via of the first set of vias. As described above, each of the parallel plate capacitors including i) a partial via (e.g., 802) that extends from a grounding connection on the third conductive layer and ii) a pad (e.g., 810) located at a distal end of the partial via, the distal end being farther from the third conductive layer and the pad being parallel to the second conductive layer. The parallel plate capacitors operate as an RF short circuit between the first via and the grounding connection at RF frequencies. The parallel plate capacitors enable RF shielding between two of the first plurality of conductive traces. That is, the parallel plate capacitors enable RF shielding between a first RF signal and a second RF signal.

In another embodiment, a circuit board includes a first layer with a first portion of a RF coupling structure and a second layer with a second portion of the RF coupling structure. A first insulation layer is located between the first layer and the second layer. The RF coupling structure is configured to electromagnetically couple a first conductive trace on the first layer and a second conductive trace on the second layer at RF frequencies. The circuit board also includes a third layer having a first antenna element. A second insulation layer is located between the third layer and the first layer. The circuit board also includes an RF shielding structure coupled to a ground connection on the second layer and located in the first insulation layer. The RF shielding structure is configured to operate as a RF short circuit between the ground connection and a third conductive trace on the first layer at RF frequencies.

In a further embodiment, the second insulation layer includes a first via through which the first antenna element is coupled to the first conductive trace. An RF component that is disposed on the circuit board includes a ground terminal. The ground terminal is coupled to the ground connection through a second via. The RF shielding structure operates as a short circuit between the ground terminal of the antenna element and the ground terminal of the RF component even though two layers of the circuit board are not conductively coupled, rather electromagnetically couples. The RF shielding structure operates as an RF short circuit at RF frequencies through the insulation layer where the electromagnetically coupled RF signals are present. The RF shielding structure operates like a fence of ground vias that shield an RF signal from another RF signal.

In a further embodiment, the circuit board further includes a fourth layer with a fourth conductive trace. A third insulation layer is located between the second layer and the fourth layer. The second insulation layer includes a first via through which the first antenna element is coupled to the first conductive trace. The second insulation layer also includes a second via through which the ground connection is coupled to a ground terminal of RF component disposed on the circuit board. The third insulation layer includes a third via extending between the second conductive trace and the fourth conductive trace, the fourth conductive trace being coupled to a signal terminal of the RF component.

In another embodiment, the first layer, the third layer, and the second insulation layer are part of a first sub-stack that is laminated together in a first lamination cycle. The second layer, the fourth layer, and the third insulation layer are part of a second sub-stack that is laminated together in a second lamination cycle. The first sub-stack and the second sub-stack are laminated together in a third lamination cycle after the first lamination cycle and after the second lamination cycle. The insulation layer (e.g., 806) is located between the first sub-stack and the second sub-stack. In another embodiment, the second sub-stack includes one or more additional conductive layers and one or more additional insulation layers. A set of vias can be coupled between two of the conductive layers.

In another embodiment, the first layer includes a second antenna element and a first portion of a second RF coupling structure coupled to the second antenna element. The second layer includes a second portion of the second RF coupling structure. The second RF coupling structure is configured to electromagnetically couple the second antenna element and a fourth conductive trace on the second layer at RF frequencies. The RF shielding structure is located between the RF coupling structure and the second RF coupling structure.

In another embodiment, a fourth layer includes a second antenna element. A third insulation layer is located between the first layer and the fourth layer. The second insulation layer and third insulation layer include a second via through which the second antenna element is coupled to a fourth conductive trace of the first layer, the fourth conductive trace being coupled to a first portion of a second RF coupling structure. The RF shielding structure is located between the RF coupling structure and the second RF coupling structure.

In another embodiment, a device includes a processor and a RF component disposed on a side of a circuit board. The circuit board includes a first layer having a set of antenna elements of a phased array antenna. The set of antenna elements is located on a first side of the circuit board and the processor and the RF component are located on a second side of the circuit board. The circuit board further includes: a second layer having a first set of conductive traces; a first set of vias, each coupling one of the set of antenna elements to one of the first set of conductive traces through a first insulation layer; a third layer having a second set of conductive traces; a second insulation layer located between the second layer and the third layer; and a set of vertical coupling structures, each including i) a first portion located in the second layer and coupled to one of the first plurality of conductive traces and ii) a second portion located in the third layer and coupled to one of the second plurality of conductive traces. The circuit board also includes an RF shielding structure that is coupled to a first trace of the second set of conductive traces, the first trace being grounded to at least one of the processor or the RF component. The RF shielding structure is configured to operate as a RF short circuit between the first trace and a first trace of the first set of conductive traces.

In a further embodiment, the RF shielding structure includes a set of two or more parallel plate capacitors. Each of the parallel plate capacitors can include i) a partial via that extends from a grounding connection on the third layer and ii) a pad located at a distal end of the partial via, the distal end being farther from the third layer and the pad being parallel to the third layer. In another embodiment, a second set of vias can couple each of the second set of conductive traces to at least one of the processor or the RF component. Each of the second set of vias can be coupled to one of the second set of conductive traces and one of a third set of conductive traces in a fourth layer.

Figure 9:
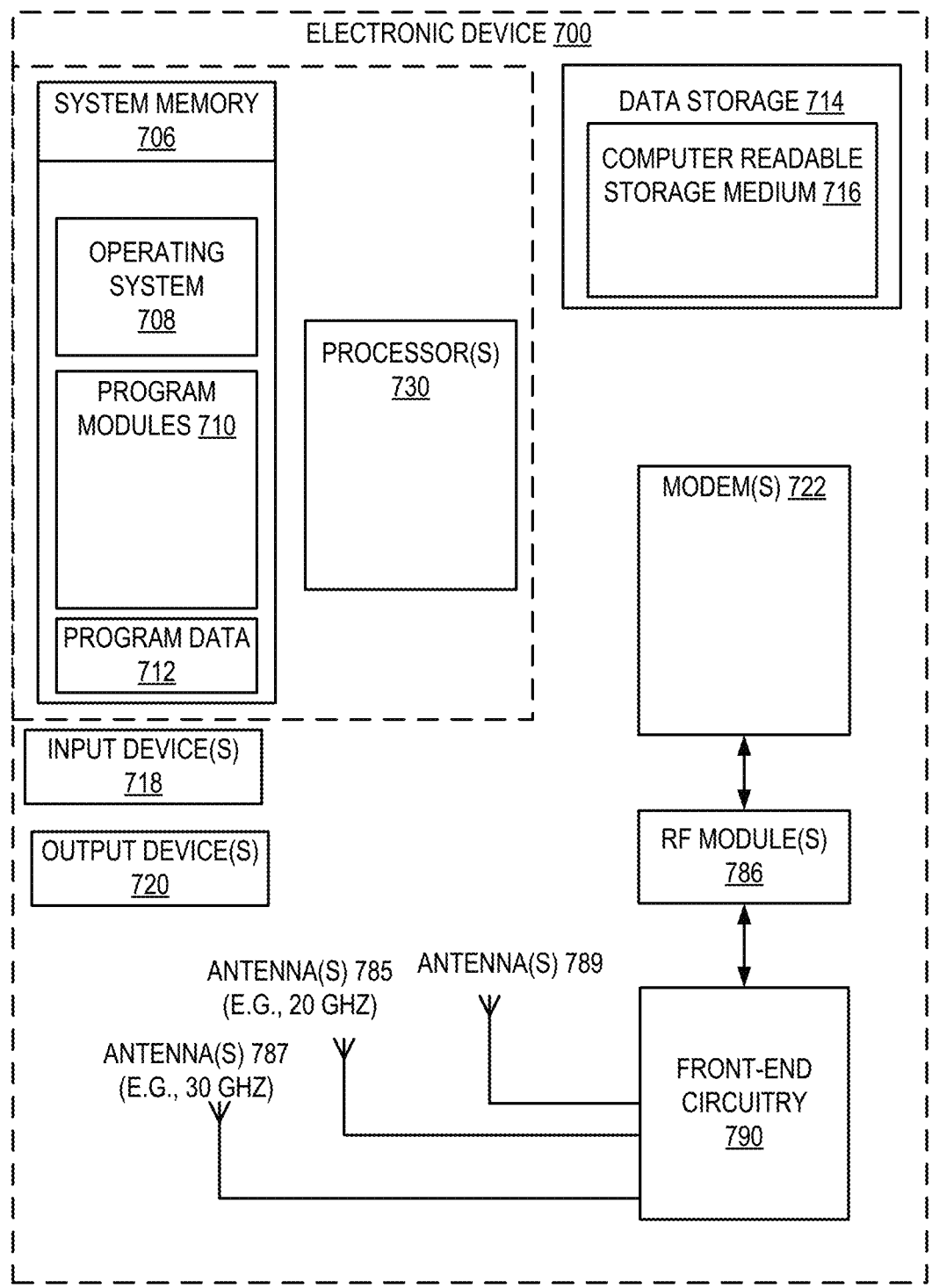
FIG. 9 is a block diagram of an electronic device that includes vertical coupling structures for antenna feeds of phased array antennas as described herein according to one embodiment.

FIG. 9 is a block diagram of an electronic device that includes vertical coupling structure for antenna feeds of phased array antennas as described herein according to one embodiment. In one embodiment, the electronic device 900 includes the vertical coupling structures 101 of FIG. 1. In another embodiment, the electronic device 900 includes the vertical coupling structures 201 of FIG. 2. In another embodiment, the electronic device 900 includes the vertical coupling structures of FIG. 4. In another embodiment, the electronic device 900 includes the vertical coupling structure 508 of FIG. 5. In another embodiment, the electronic device 900 includes any of the structures 600, 620, 640, 660, 680, or 690 of FIGS. 6A-6F, respectively. The vertical antenna structures can be used to electromagnetically couple antenna elements of the antennas 985-989 to the front-end circuitry 990, the RF modules 986, or any combination thereof. In another embodiment, the electronic device 900 includes a RF shielding structure, such as the RF shielding structure 800 of FIG. 8. Alternatively, the electronic device 900 may be other electronic devices that include any combination of the vertical coupling structures and the RF shielding structures, as described herein.

The electronic device 900 includes one or more processor(s) 930, such as one or more CPUs, microcontrollers, field programmable gate arrays, or other types of processors. The electronic device 900 also includes system memory 906, which may correspond to any combination of volatile and/or non-volatile storage mechanisms. The system memory 906 stores information that provides operating system component 908, various program modules 910, program data 912, and/or other components. In one embodiment, the system memory 906 stores instructions of methods to control operation of the electronic device 900. The electronic device 900 performs functions by using the processor(s) 930 to execute instructions provided by the system memory 906.

The electronic device 900 also includes a data storage device 914 that may be composed of one or more types of removable storage and/or one or more types of non-removable storage. The data storage device 914 includes a computer-readable storage medium 916 on which is stored one or more sets of instructions embodying any of the methodologies or functions described herein. Instructions for the program modules 910 may reside, completely or at least partially, within the computer-readable storage medium 916, system memory 906 and/or within the processor(s) 930 during execution thereof by the electronic device 900, the system memory 906, and the processor(s) 930 also constituting computer-readable media. The electronic device 900 may also include one or more input devices 918 (keyboard, mouse device, specialized selection keys, etc.) and one or more output devices 920 (displays, printers, audio output mechanisms, etc.).

The electronic device 900 further includes a modem 922 to allow the electronic device 900 to communicate via a wireless connections (e.g., such as provided by the wireless communication system) with other computing devices, such as remote computers, an item providing system, and so forth. The modem 922 can be connected to one or more RF modules 986. The RF modules 986 may be a wireless local area network (WLAN) module, a wide area network (WAN) module, wireless personal area network (WPAN) module, Global Positioning System (GPS) module, or the like. The antenna structures (antenna(s) 985, 987, 989) are coupled to the front-end circuitry 990, which is coupled to the modem 922. The front-end circuitry 990 may include radio front-end circuitry, antenna switching circuitry, impedance matching circuitry, or the like. The antennas 985, 987, 989 may be GPS antennas, Near-Field Communication (NFC) antennas, other WAN antennas, WLAN or PAN antennas, or the like. The modem 922 allows the electronic device 900 to handle both voice and non-voice communications (such as communications for text messages, multimedia messages, media downloads, web browsing, etc.) with a wireless communication system. The modem 922 may provide network connectivity using any type of mobile network technology including, for example, Cellular Digital Packet Data (CDPD), General Packet Radio Service (GPRS), EDGE, Universal Mobile Telecommunications System (UMTS), Single-Carrier Radio Transmission Technology (1×RTT), Evaluation Data Optimized (EVDO), High-Speed Down-Link Packet Access (HSDPA), Wi-Fi®, Long Term Evolution (LTE) and LTE Advanced (sometimes generally referred to as 4G), etc.

The modem 922 may generate signals and send these signals to antenna(s) 985, 987, 989 of a first type (e.g., 20 GHz), antenna(s) 985 of a second type (e.g., 30 GHz), and/or antenna(s) 987 of a third type (e.g., WAN, WLAN, PAN, or the like), via front-end circuitry 990, and RF module(s) 986 as descried herein. Antennas 985, 987, 989 may be configured to transmit in different frequency bands and/or using different wireless communication protocols. The antennas 985, 987, 989 may be directional, omnidirectional, or non-directional antennas. In addition to sending data, antennas 985, 987, 989 may also receive data, which is sent to appropriate RF modules connected to the antennas. One of the antennas 985, 987, 989 may be any combination of the antenna structures described herein.

In one embodiment, the electronic device 900 establishes a first connection using a first wireless communication protocol, and a second connection using a different wireless communication protocol. The first wireless connection and second wireless connection may be active concurrently, for example, if an electronic device is receiving a media item from another electronic device via the first connection) and transferring a file to another electronic device (e.g., via the second connection) at the same time. Alternatively, the two connections may be active concurrently during wireless communications with multiple devices. In one embodiment, the first wireless connection is associated with a first resonant mode of an antenna structure that operates at a first frequency band and the second wireless connection is associated with a second resonant mode of the antenna structure that operates at a second frequency band. In another embodiment, the first wireless connection is associated with a first antenna structure and the second wireless connection is associated with a second antenna.

Though a modem 922 is shown to control transmission and reception via antenna (985, 987, 989), the electronic device 900 may alternatively include multiple modems, each of which is configured to transmit/receive data via a different antenna and/or wireless transmission protocol.

In the above description, numerous details are set forth. It will be apparent, however, to one of ordinary skill in the art having the benefit of this disclosure, that embodiments may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to convey the substance of their work most effectively to others skilled in the art. An algorithm is used herein, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "inducing," "parasitically inducing," "radiating," "detecting," "determining," "generating," "communicating," "receiving," "disabling," or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

Embodiments also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but not limited to, any type of disk including floppy disks, optical disks, Read-Only Memories (ROMs), compact disc ROMs (CD-ROMs) and magnetic-optical disks, Random Access Memories (RAMs), EPROMs, EEPROMs, magnetic or optical cards, or any type of media suitable for storing electronic instructions.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the present embodiments as described herein. It should also be noted that the terms "when" or the phrase "in response to," as used herein, should be understood to indicate that there may be intervening time, intervening events, or both before the identified operation is performed.

It is to be understood that the above description is intended to be illustrative, and not restrictive. Many other embodiments will be apparent to those of skill in the art upon reading and understanding the above description. The scope of the present embodiments should, therefore, be determined with reference to the appended claims, along with the full scope of equivalents to which such claims are entitled.

What is claimed is:

1. A wireless device comprising:
   a digital signal processor (DSP);
   radio frequency (RF) components; and
   a printed circuit board (PCB) comprising a stack of layers, the stack of layers comprising a first sub-stack of layers, a first insulation layer, and a second sub-stack of layers, wherein:
   the first sub-stack of layers comprises:
   i) a first conductive layer comprising a plurality of antenna elements located on a first side of the PCB;
   ii) a second conductive layer comprising a first plurality of conductive traces;
   iii) a second insulation layer located between the first conductive layer and the second conductive layer; and
   iv) a first set of vias in the second insulation layer, each of the first set of vias connects one of the plurality of antenna elements to one of the first plurality of conductive traces through the second insulation layer;
   the second sub-stack of layers comprises:
   i) a third conductive layer comprising a second plurality of conductive traces;
   ii) a fourth conductive layer comprising a third plurality of conductive traces;
   iii) a third insulation layer located between the third conductive layer and the fourth conductive layer; and
   iv) a second set of vias in the third insulation layer, each of the second set of vias connects each of the second plurality of conductive traces to one of the third plurality of conductive traces through the third insulation layer;
   the DSP and the RF components are located on a second side of the PCB; and
   the second conductive layer, the first insulation layer, and the third conductive layer form a plurality of RF couplers that electromagnetically couple the plurality of antenna elements to the RF components.

2. The wireless device of claim 1, wherein the first sub-stack of layers are laminated together to form a first laminated sub-stack, the second sub-stack of layers are laminated together to form a second laminated sub-stack, and the first and the second laminated sub-stacks are laminated together to form the stack of layers.

3. The wireless device of claim 1, wherein the plurality of RF couplers comprises at least one quadrature hybrid coupler that enables radiating electromagnetic energy with a circular polarization.

4. A circuit board comprising:
   a first layer, the first layer comprising a first portion of a radio frequency (RF) coupling structure;
   a second layer, the second layer comprising a second portion of the RF coupling structure;
   a first insulation layer located between the first layer and the second layer, wherein the RF coupling structure is configured to electromagnetically couple a first conductive trace on the first layer and a second conductive trace on the second layer at RF frequencies;
   a third layer comprising a first antenna element; and
   a second insulation layer located between the third layer and the first layer, wherein the second insulation layer comprises a first via through which the first antenna element is coupled to the first conductive trace.

5. The circuit board of claim 4, further comprising:
a fourth layer comprising a third conductive trace; and
a third insulation layer located between the second layer and the fourth layer, wherein the third insulation layer comprises a second via extending between the second conductive trace and the third conductive trace, wherein the third conductive trace is coupled to a RF component disposed on the circuit board.

6. The circuit board of claim 5, wherein:
the first layer, the third layer, and the second insulation layer are part of a first sub-stack;
the second layer, the fourth layer, and the third insulation layer are part of a second sub-stack; and
the first sub-stack and the second sub-stack are laminated together.

7. The circuit board of claim 4, wherein:
the first layer, the third layer, and the second insulation layer are part of a first sub-stack;
the second layer is part of a second sub-stack; and
the second sub-stack comprises:
a plurality of additional conductive layers;
a plurality of additional insulation layers; and
a plurality of sets of vias, each set of vias connecting at least two of the plurality of additional conductive layers through one or more of the plurality of additional insulation layers.

8. The circuit board of claim 4, wherein:
the first layer comprises a second antenna element and a first portion of a second RF coupling structure coupled to the second antenna element;
the second layer comprises a second portion of the second RF coupling structure; and
the second RF coupling structure is configured to electromagnetically couple the second antenna element and a third conductive trace on the second layer at RF frequencies.

9. The circuit board of claim 4, further comprising:
a fourth layer comprising a second antenna element; and
a third insulation layer located between the first layer and the fourth layer, wherein the second insulation layer and the third insulation layer comprise a second via through which the second antenna element is coupled to a third conductive trace of the first layer, the third conductive trace being coupled to a first portion of a second RF coupling structure.

10. The circuit board of claim 4, wherein:
the first insulation layer comprises a plurality of parallel plate capacitors in series with grounding connection on the second layer, each of the plurality of parallel plate capacitors comprises i) a partial via that extends from the grounding connection on the second layer and ii) a pad located at a distal end of the partial via, the distal end being farther from the second layer and the pad being parallel to the first layer;
the plurality of parallel plate capacitors operate as an RF short circuit between the first via and the grounding connection at RF frequencies; and
the plurality of parallel plate capacitors enable RF shielding between the first conductive trace on the first layer and a third conductive trace on the first layer.

11. The circuit board of claim 4, wherein:
an RF shielding structure coupled to a ground connection on the second layer and located in the first insulation layer, wherein the RF shielding structure is configured to operate as a RF short circuit between the ground connection and a third conductive trace on the first layer at RF frequencies.

12. The circuit board of claim 11, wherein the RF shielding structure comprises a plurality of parallel plate capacitors, each comprising i) a partial via that extends from a grounding connection on the second layer and ii) a pad located at a distal end of the partial via, the distal end being farther from the second layer and the pad being parallel to the first layer.

13. The circuit board of claim 4, wherein:
the first layer, the third layer, and the second insulation layer are part of a first sub-stack comprising a first solder mask, at least two conductive layers and an insulation layer between each of the at least two conductive layers, and a first set of through-hole vias that pass through the at least two conductive layers and the insulation layer in the first sub-stack;
the second layer is part of a second sub-stack comprising a second solder mask, at least two conductive layers and an insulation layer between each of the at least two conductive layers of the second sub-stack, and a second set of through-hole vias that pass through the at least two conductive layers and the insulation layer in the second sub-stack; and
a second set of microvias that pass through the insulation layer in the second sub-stack.

14. The circuit board of claim 4, wherein the RF coupling structure comprises a quadrature hybrid coupler.

15. A device comprising:
a processor;
a radio frequency (RF) component; and
a circuit board comprising:
a first layer comprising a plurality of antenna elements of a phased array antenna, the plurality of antenna elements being located on a first side of the circuit board;
a second layer comprising a first plurality of conductive traces;
a first set of vias, each coupling one of the plurality of antenna elements to one of the first plurality of conductive traces through a first insulation layer;
a third layer comprising a second plurality of conductive traces;
a second insulation layer located between the second layer and the third layer;
a plurality of vertical coupling structures, each comprising i) a first portion located in the second layer and coupled to one of the first plurality of conductive traces and ii) a second portion located in the third layer and coupled to one of the second plurality of conductive traces; and
a second set of vias, each coupling one of the second plurality of conductive traces to at least one of the processor or the RF component.

16. The device of claim 15, wherein the circuit board further comprises:
a fourth layer comprising a third plurality of conductive traces;
a third insulation layer located between the third layer and the fourth layer, wherein each of the second set of vias is coupled to one of the second plurality of conductive traces to one of the third plurality of conductive traces.

17. The device of claim 15, wherein:
the first layer, the second layer, and the first insulation layer are laminated together to form a first stack;

the third layer and the second insulation layer are laminated together to form a second stack; and the first stack, the first insulation layer, and the second stack are laminated together to form the circuit board.

18. The device of claim 17, wherein the circuit board further comprises an RF shielding structure coupled to a ground connection on the third layer and located in the second insulation layer, wherein the RF shielding structure is configured to operate as a RF short circuit between the ground connection and at least one of the first plurality of conductive traces.

19. The device of claim 18, wherein the RF shielding structure comprises a plurality of parallel plate capacitors, each comprising i) a partial via that extends from a grounding connection on the third layer and ii) a pad located at a distal end of the partial via, the distal end being farther from the third layer and the pad being parallel to the second layer.

20. The device of claim 15, wherein at least one of the plurality of vertical coupling structures is a quadrature hybrid coupler.

\* \* \* \* \*